(12) United States Patent
Muraya (10) Patent No.: US 8,799,684 B2
(45) Date of Patent: Aug. 5, 2014

(54) APPARATUS, METHOD AND PROCESS TO DETERMINE A THRESHOLD VOLTAGE SO THAT LEAKAGE POWER OF A PLURALITY OF TRANSISTORS IS INVERSELY PROPORTIONAL TO A PLURALITY OF PROCESSOR CORES

(75) Inventor: Keisuke Muraya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1135 days.

(21) Appl. No.: 12/562,738

(22) Filed: Sep. 18, 2009

(65) Prior Publication Data
US 2010/0011189 A1    Jan. 14, 2010

Related U.S. Application Data

(63) Continuation of application No. PCT/JP2007/056983, filed on Mar. 29, 2007.

(51) Int. Cl.
*G06F 1/00* (2006.01)
*G06F 17/50* (2006.01)

(52) U.S. Cl.
USPC ............................. 713/300; 716/100; 716/110

(58) Field of Classification Search
USPC .......... 713/300; 716/100, 106, 109, 110–111, 716/132–133, 136–137
See application file for complete search history.

(56) References Cited

U.S. PATENT DOCUMENTS

| 7,216,310 B2 * | 5/2007 | Chatterjee et al. ............. 716/115 |
| 7,624,295 B2 * | 11/2009 | Taketoshi et al. ............. 713/500 |
| 2005/0116765 A1 * | 6/2005 | Sakiyama et al. ............. 327/534 |
| 2010/0005328 A1 * | 1/2010 | Rakshani et al. ............. 713/322 |

FOREIGN PATENT DOCUMENTS

| JP | 2001-51957 | 2/2001 |
| JP | 2003-209616 | 7/2003 |
| JP | 2006-134350 | 5/2006 |

OTHER PUBLICATIONS

International Preliminary Report on Patentability, mailed Oct. 20, 2009, in corresponding International Application No. PCT/JP2007/056983 (5 pp.).
English Language International Search Report for PCT/JP2007/056983, mailed Jul. 10, 2007.

* cited by examiner

*Primary Examiner* — Suresh Suryawanshi
(74) *Attorney, Agent, or Firm* — Staas & Halsey LLP (57) ABSTRACT

An information processing device includes a plurality of processor cores each including a plurality of transistors, and at least one substrate bias circuit that supplies each of the plurality of transistors with a substrate bias voltage that is determined based on the number of the processor cores.

15 Claims, 9 Drawing Sheets

|  | Ion_N | Ioff_N | Ion_P | Ioff_P | Ion | Ioff | CLOCK |
|---|---|---|---|---|---|---|---|
| 3σSlow | 700 | 10 | 350 | 10 | 735 | 16 | 1500 |
| Typ. | 1000 | 100 | 450 | 100 | 995 | 160 | 2000 |
| 3σFast | 1300 | 1000 | 550 | 1000 | 1255 | 1600 | 3000 |
|  | [uA] | [nA] | [uA] | [nA] | [uA] | [nA] | [MHz] |

FIG. 9

| SIMPLE INCREASE | | | | | |
|---|---|---|---|---|---|
| NUMBER OF CORES | CLOCK | LEAKAGE POWER | ACTIVE POWER | PERFORMANCE | PERFORMANCE /POWER RATIO |
| 1 | 2,013 | 50 | 60 | 403 | 3.65 |
| 2 | 2,013 | 100 | 121 | 805 | 3.65 |
| 3 | 2,013 | 150 | 181 | 1,208 | 3.65 |
| 4 | 2,013 | 200 | 242 | 1,610 | 3.65 |
| 5 | 2,013 | 250 | 302 | 2,013 | 3.65 |
| 6 | 2,013 | 300 | 362 | 2,416 | 3.65 |
| 7 | 2,013 | 350 | 423 | 2,818 | 3.65 |
| 8 | 2,013 | 400 | 483 | 3,221 | 3.65 |
| [PIECES] | [MHz] | [W] | [W] | [10MIPS] | [10MIPS/W] |

FIG. 10

| CLOCK ADJUSTMENT | | | | | |
|---|---|---|---|---|---|
| NUMBER OF CORES | CLOCK | LEAKAGE POWER | ACTIVE POWER | PERFORMANCE | PERFORMANCE /POWER RATIO |
| 1 | 2,013 | 50 | 60 | 403 | 3.65 |
| 2 | 1,006 | 100 | 60 | 403 | 2.51 |
| 3 | 671 | 150 | 60 | 403 | 1.91 |
| 4 | 503 | 200 | 60 | 403 | 1.55 |
| 5 | 403 | 250 | 60 | 403 | 1.30 |
| 6 | 335 | 300 | 60 | 403 | 1.12 |
| 7 | 288 | 350 | 60 | 403 | 0.98 |
| 8 | 252 | 400 | 60 | 403 | 0.87 |
| [PIECES] | [MHz] | [W] | [W] | [10MIPS] | [10MIPS/W] |

FIG. 11

| LEAKAGE ADJUSTMENT | | | | | |
|---|---|---|---|---|---|
| NUMBER OF CORES | CLOCK | LEAKAGE POWER | ACTIVE POWER | PERFORMANCE | PERFORMANCE /POWER RATIO |
| 1 | 2,013 | 50 | 60 | 403 | 3.65 |
| 2 | 1,818 | 50 | 109 | 727 | 4.57 |
| 3 | 1,713 | 50 | 154 | 1,028 | 5.03 |
| 4 | 1,642 | 50 | 197 | 1,314 | 5.32 |
| 5 | 1,589 | 50 | 238 | 1,589 | 5.51 |
| 6 | 1,547 | 50 | 279 | 1,857 | 5.65 |
| 7 | 1,513 | 50 | 318 | 2,118 | 5.76 |
| 8 | 1,483 | 50 | 356 | 2,373 | 5.85 |
| [PIECES] | [MHz] | [W] | [W] | [10MIPS] | [10MIPS/W] |

APPARATUS, METHOD AND PROCESS TO DETERMINE A THRESHOLD VOLTAGE SO THAT LEAKAGE POWER OF A PLURALITY OF TRANSISTORS IS INVERSELY PROPORTIONAL TO A PLURALITY OF PROCESSOR CORES

CROSS-REFERENCE TO RELATED APPLICATIONS

This application is a continuation application, filed under 35 U.S.C. §111(a), of PCT Application No. PCT/JP2007/056983, filed Mar. 29, 2007, the disclosure of which is herein incorporated in its entirety by reference.

FIELD

The present invention relates to an information processing device and method for designing an information processing device.

BACKGROUND

Performance of an information processing device can be improved by integrating plural microprocessor cores (which will be hereinafter simply referred to as cores) in one LSI (Large Scale Integrated circuit) chip or by building plural microprocessor chips in an information processing device.

As relevant conventional techniques, there are a semiconductor device and a mobile terminal device which suppress power consumption due to leakage currents by removing unnecessary circuit operation.

However, in case of improving performance by increasing the number of cores, power consumption increases and accordingly limits cooling and power supply if the number of cores is simply increased. Details of power consumption are active power and leakage power. Even if the active power is suppressed by lowering an operation speed (clock frequency), the leakage power cannot be suppressed. Therefore, the leakage power increases in accordance with increase in number of cores. Consequently, where evaluated as performance per electric power (W), e.g., MIPS (Mega Instruction Per Second), there is a problem that a ratio of performance to electric power decreases as the number of cores increases, according to the scheme of suppressing the active power by lowering the clock frequency.

Another scheme of lowering the power supply voltage has a drawback that an adjustable range is narrow because the power supply voltage is limited by a relationship with an interface voltage for outside of the system or because there is no substantial margin for reduction with respect to a resent power supply voltage of 1.0 V.

[Patent Document] Japanese Laid-Open Patent Publication No. 2003-209616

SUMMARY

According to an aspect of the invention, an information processing device includes a plurality of processor cores each including a plurality of transistors, and at least one substrate bias circuit that supplies each of the plurality of transistors with a substrate bias voltage that is determined based on the number of the processor cores.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings.

First Embodiment

This embodiment will be described with reference to an example of applying the present invention to a microprocessor LSI having plural cores (processor cores).

A cause of decrease in ratio of performance to electric power exists in that leakage power stays unchanged while active power decreases as a clock frequency is decreased. Since the leakage power depends on a total of leakage currents Ioff from transistors, Ioff of transistors in cores may be decreased in order to reduce the leakage power.

Based on Vgs (gate-source voltage)-Ids (drain-source current) characteristic of transistors, Ids at which Vgs is 0 is expressed as Ioff (Off current, Off-state current), and Ids at which Vgs is power supply voltage Vdd is expressed as Ion (On current, On-state current). Although a threshold voltage Vth can be variously defined, Vgs at which Ids=I μA is satisfied is expressed as Vth. Accordingly, due to the Vgs-Ids characteristic, Vth increases, Ion decreases and operation speed decreases as Ioff decreases.

However, a decrease of operation speed relative to a decrease of Ioff is smaller than a decrease of operation speed relative to a decrease of active power. Therefore, by adjusting Ioff, the leakage power can be decreased while suppressing deterioration of performance, and the ratio of performance to power can accordingly be improved.

Described next will be adjustment of Vth (Ioff) in a transistor (CMOS).

Figure 1:
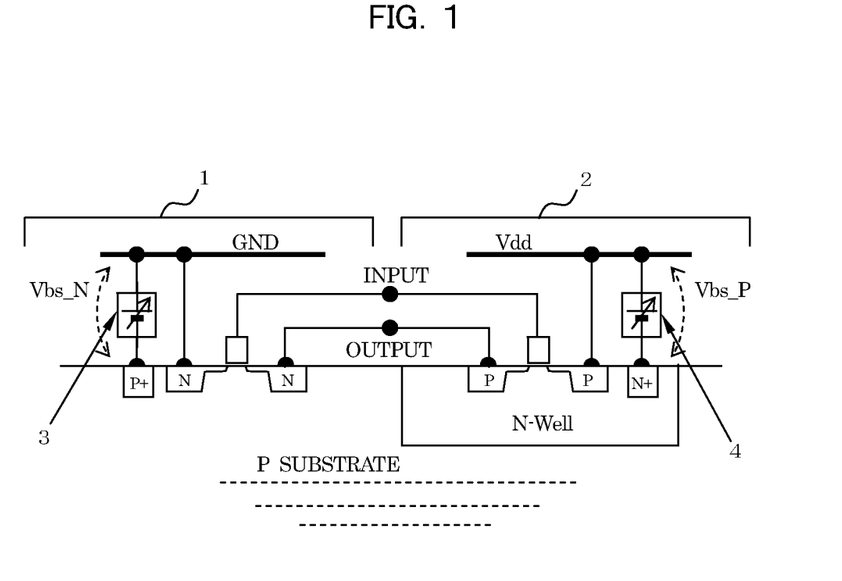
FIG. 1 is a diagram depicting a structure of an example of a transistor.

FIG. 1 is a diagram depicting a structure of an example of a transistor. In the transistor depicted in this figure, a source of NMOS 1 is connected to a ground potential GND, and a source of PMOS 2 is connected to a power supply potential VDD. In this description, Vbs_N is a voltage between a back gate (substrate) and the source of the NMOS, and Vbs_P is a voltage between a back gate and the source of the PMOS. A substrate bias circuit 3 is provided between the back gate and the source of the NMOS, and a substrate bias circuit 4 is provided between the back gate and the source of the PMOS. Since the substrate bias circuit 3 provides Vbs_N and the substrate bias circuit 4 provides Vbs_P, Vth can be controlled.

Described next will be an example of a design program (a program for designing an information processing device) for determining a number of cores and Vth in a LSI chip having at least one core. This design program runs on a design device which is constituted by a PC (Personal Computer) or a server. The design program is executed on a memory of a design device by a CPU inside the design device. The CPU inside the design device writes the result of the executing the design program, to a storage inside the design device.

At first, a first design program will be described.

Figure 2:
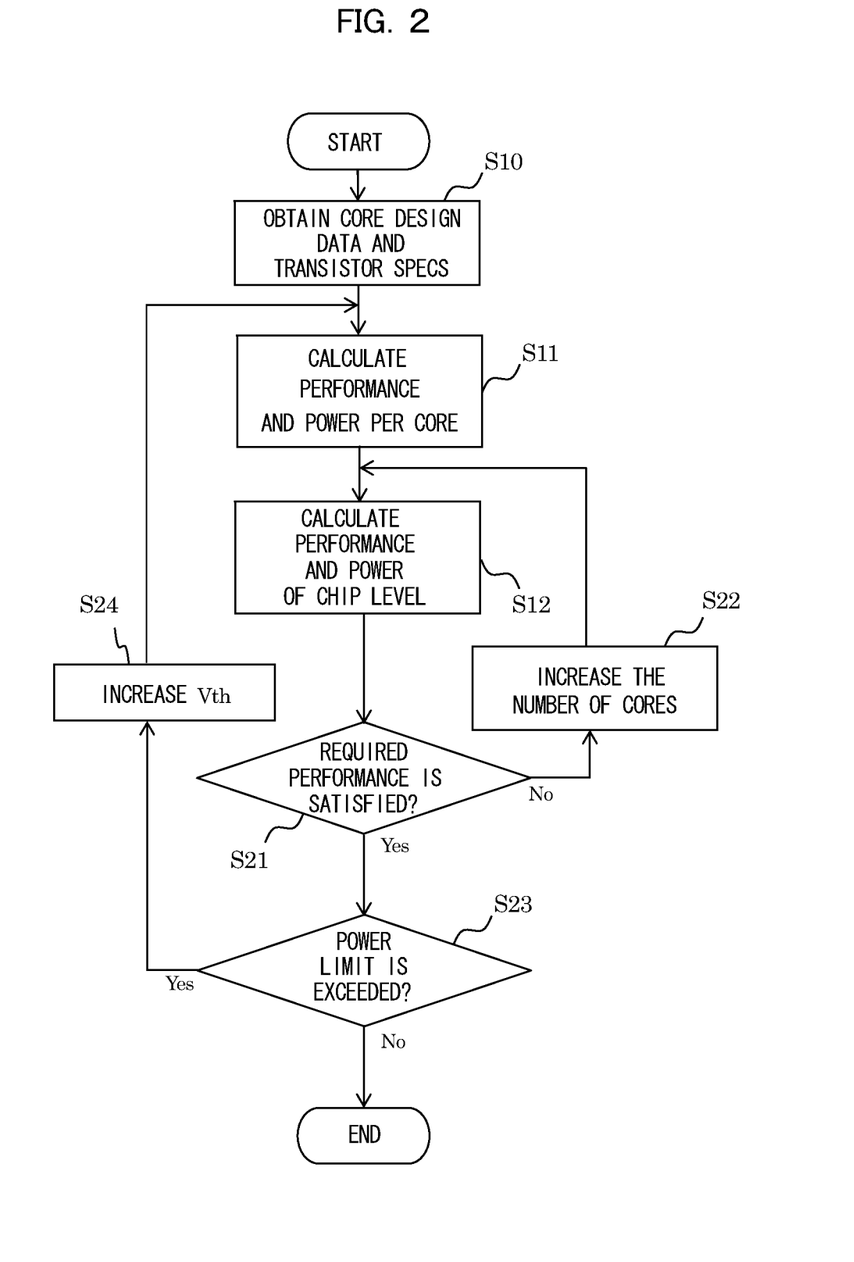
FIG. 2 is a flowchart depicting an example of a first design program.

FIG. 2 is a flowchart depicting an example of the first design program. According to the first design program, firstly, core design data prepared in advance and transistor specs applied to cores are obtained from the storage device (S10). Calculated from the core design data and the transistor specs are performance per core (clock frequency (Hz)) and power per core (leakage power (W) and active power (W)) (S11). The core design data is designed by external design tools or by converting design rules with use of design data concerning the entire or internal blocks of a previous-generation core. The transistor specs include values such as Ion, Ioff, and Vth. The clock frequency is calculated by a timing design tool. The leakage power is calculated from a total transistor width. The active power is calculated from (total transistor capacity plus wiring capacity) and the clock frequency.

Next, according to the first design program, chip specs prepared in advance are obtained, and performance of a chip level (MIPS) and power (leakage power (W) and active power (W)) of the chip level are calculated from the chip specs and a calculation result of the processing step S11 (S12). The chip specs include required performance (MIPS) and a power limit (cooling limit (W) or power supply limit (W)). Next, the first design program determines whether the performance of the chip level satisfies the required performance or not (S21).

If the required performance is not satisfied (S21, N), the number of cores is increased to increase the performance of the chip level, the leakage power and active power (S22) by the first design program, which then returns to the processing step S12. If the required performance is satisfied (S21, Y), whether the power of the chip level (leakage power plus active power) exceeds the power limit or not is determined by the first design program (S23).

If the power limit is exceeded (S23, Y), Vth is increased (by decreasing Ioff) (S24), and the first design program returns to the processing step S11. In this step, Ioff is set so that, for example, the leakage power is inversely proportional to the number of cores. If the power limit is not exceeded (S23, N), this flow ends.

Through this flow, the number of cores in a multi-core chip and Vth (Ioff) are determined.

Next, a second design program will be described.

Figure 3:
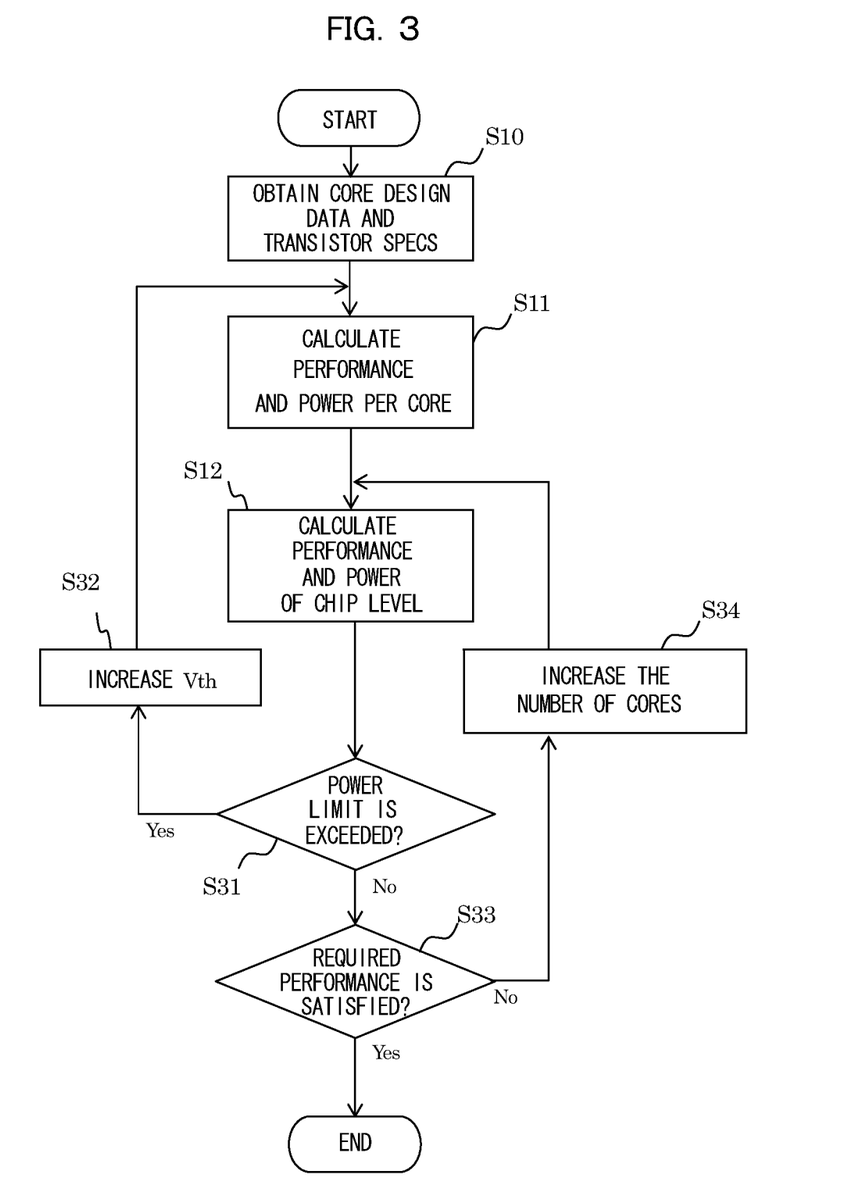
FIG. 3 a flowchart depicting an example of a second design program.

FIG. 3 is a flowchart depicting an example of the second design program. In this figure, common reference symbols to FIG. 2 denote the same or equivalent processings as or to those in FIG. 2, and descriptions of which will be omitted herefrom. Compared with the first design program, processing's are executed in a different order by the second design program. According to the second design program, the same processing steps S10, S11, and S12 as those in the first design program are executed first. Next, whether the power of a chip level (leakage power plus active power) exceeds the power limit or not is determined (S31) by the second design program.

If the power limit is exceeded (S31, Y), Vth is increased (by decreasing Ioff) (S32) by the second design program, which then returns to the processing step S11. If the power limit is not exceeded (S31, N), whether the required performance of the chip level is satisfied or not is determined (S33) by the second design program.

If the required performance is not satisfied (S33, N), the number of cores is increased to increase the performance of the chip level, leakage power, and active power (S34) by the second design program, which then returns to the processing step S12. If the required performance is satisfied (S33, Y), this flow ends.

Through this flow, the number of cores in a multi-core chip and Vth (Ioff) are determined, and Vbs_N and Vbs_P are further determined from Vth.

According to the first and second design programs described above, a chip having equivalent performance with lower power consumption can be designed, compared with a case of adjusting chip performance and power only by clock frequency.

Operation of the design programs described above may be applied to designing of a multi-processor system having at least one processor. In this case, the number of processors is used in place of the number of cores, and parameters of a system level are used in place of parameters of the chip level.

Described next will be examples of information processing devices using a multi-core chip which is designed by the design programs described above.

At first, a CPU peripheral circuit in a first information processing device will be described.

Figure 4:
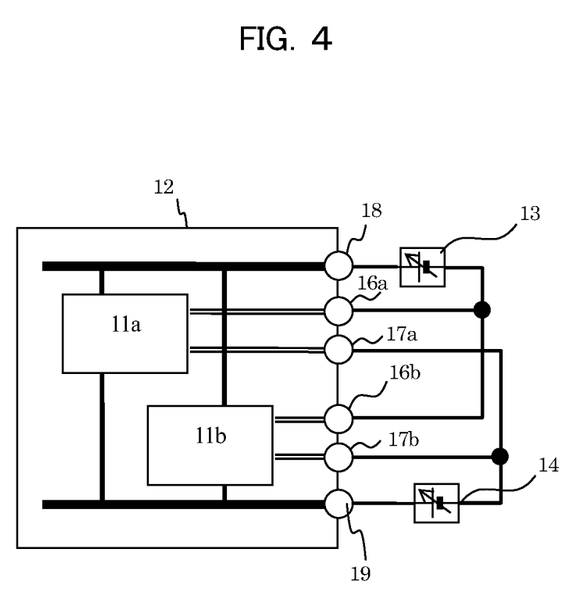
FIG. 4 is a circuit diagram depicting an example of a CPU peripheral circuit in a first information processing device.

In the first information processing device, substrate bias circuits are provided outside a CPU chip. FIG. 4 is a circuit diagram depicting an example of the CPU peripheral circuit in the first information processing device. The CPU peripheral circuit is constituted by a CPU chip 12 having two cores 11a and 11b, and two substrate bias circuits 13 and 14.

The CPU chip 12 has a VDD terminal 18 connected to VDD terminals of the cores 11a and 11b, a GND terminal 19 connected to GND terminals of the cores 11a and 11b, a Vbs_P terminal 16a connected to a back gate of PMOS in the core 11a, a Vbs_P terminal 16b connected to a back gate of PMOS in the core 11b, a Vbs_N terminal 17a connected to a back gate of NMOS in the core 11a, and a Vbs_N terminal 17b connected to a back gate of NMOS in the core 11b.

The VDD terminal 18 is connected to an external power supply potential VDD. The GND terminal 19 is connected to an external ground potential GND. The substrate bias circuit 13 is connected between VDD and the Vbs_P terminals 16a and 16b. The substrate bias circuit 14 is connected between GND and the Vbs_N terminals 17a and 17b.

According to this structure, Vth (Ioff) obtained by a design program can be set by externally setting Vbs_N and Vbs_P from outside of the CPU chip 12.

Next, a CPU chip in a second information processing device using a multi-core chip will be described.

Figure 5:
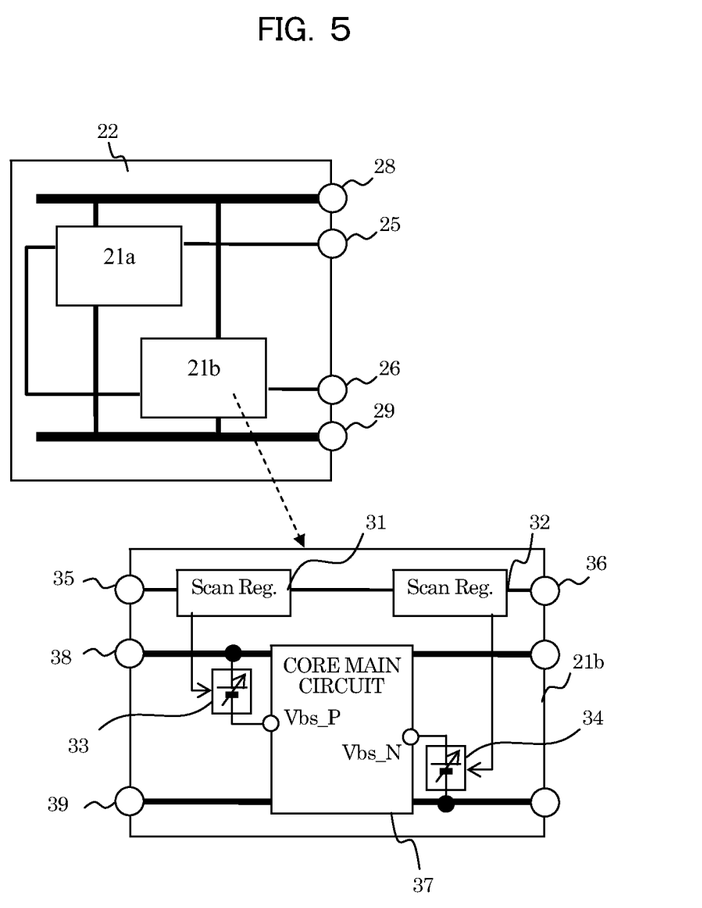
FIG. 5 is a circuit diagram depicting an example of a CPU chip in a second information processing device.

In the second information processing device, substrate bias circuits are provided inside a CPU chip. FIG. 5 is a circuit diagram depicting an example of the CPU chip in the second information processing device. The CPU chip 22 is provided with two cores 21a and 21b, a scan-in terminal 25, a scan-out terminal 26, a VDD terminal 28, and a GND terminal 29. Each of the cores 21a and 21b has scan registers 31 and 32, substrate bias circuits 33 and 34, a scan-in terminal 35, a scan-out terminal 36, a core main circuit 37, a VDD terminal 38, and a GND terminal 39.

The VDD terminal 28 is connected to the VDD terminals 38 of the cores 21a and 21b. The GND terminal 29 is connected to the GND terminals 39 of the cores 21a and 21b. The scan-in terminal 25 of the CPU chip 22 is connected to the scan-in terminal 35 of the core 21a. The scan-out terminal 36 of the core 21a is connected to the scan-in terminal 35 of the core 21b. The scan-out terminal 36 of the core 21b is connected to the scan-out terminal 36 of the CPU chip 22.

In the cores 21a and 21b each, the VDD terminal 38 is connected to a VDD terminal of the core main circuit 37, and the GND terminal 39 is connected to a GND terminal of the core main circuit 37. The substrate bias circuit 33 is connected between the VDD terminal of the core main circuit 37 and a back gate of PMOS in the core main circuit 37. The substrate bias circuit 34 is connected between the GND terminal of the core main circuit 37 and a back gate of NMOS in the core main circuit 37.

Also in the cores 21a and 21b each, the scan-in terminal 35 is connected to the scan-out terminal 36 through the scan registers 31 and 32. That is, input from the scan-in terminal 25 of the CPU chip 22 is output to the scan-in terminal 26 of the CPU chip 22, sequentially passing through the scan registers 31 and 32 of the core 21a and the scan registers 31 and 32 of the core 21b. The scan register 31 sets Vbs_P for the substrate bias circuit 33 in accordance with a value externally set from outside by scanning. The scan register 32 sets Vbs_N for the substrate bias circuit 34 in accordance with a value externally set from outside by scanning.

Vth (Ioff) which is obtained by a design program can be set by scanning in a manner of sequentially inputting values of Vbs_N for the core 21b, Vbs_P for the core 21b, Vbs_N for the core 21a, and Vbs_P for the core 21a from the scan-in terminal 25.

Next, examples of information processing devices using a multi-processor system which is designed by the design programs described above will be described.

A system board in a third information processing device using a multi-processor system will now be described.

Figure 6:
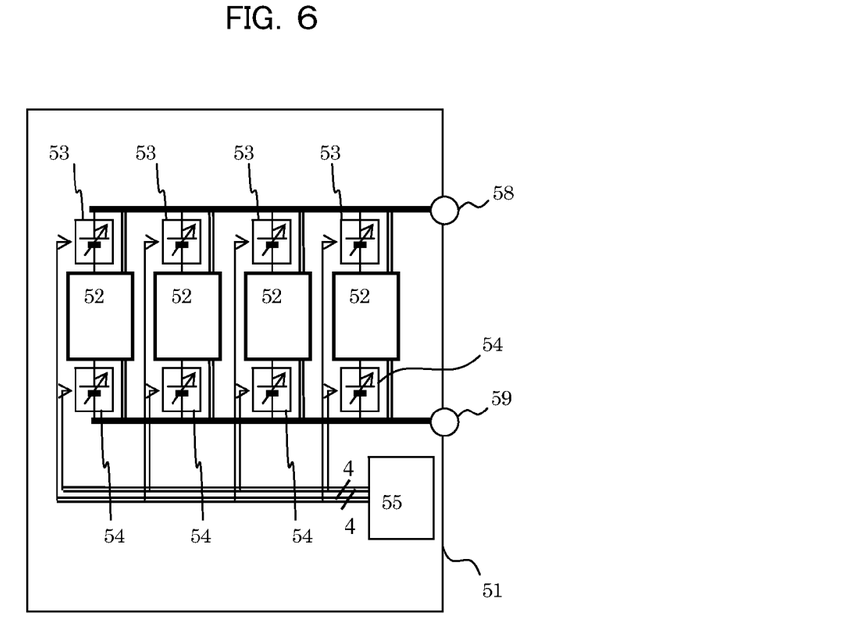
FIG. 6 is a circuit diagram depicting an example of a system board in a third information processing device.

In the third information processing device, substrate bias circuits are provided outside CPU modules (modules). The third information processing device is provided with plural system boards. FIG. 6 is a circuit diagram depicting an example of a system board in the third information processing device. The system board 51 is provided with four CPU modules 52, substrate bias circuits 53 and 54 for each of the CPU modules 52, a Vth control circuit 55, a VDD terminal 58, and a VSS terminal 59. Each of the CPU modules 52 has one core.

The Vth control circuit 55 sets a value of Vbs_P in the substrate bias circuits 53 as well as a value of Vbs_N in the substrate bias circuits 54. The substrate bias circuits 53 are connected between the VDD terminal 58 and back gates of PMOS in the CPU modules 52, and sets Vbs_P in accordance with an instruction from the Vth control circuit 55. The substrate bias circuit 54 is connected between the VSS terminal 59 and back gates of NMOS in the CPU modules 52, and sets Vbs_N in accordance with an instruction from the Vth control circuit 55.

According to the third information processing device, Vth (doff) which is obtained by a design program can be set by setting values of Vbs_N and Vbs_P in the Vth control circuit 55.

A system board in a fourth information processing device using a multi-processor system will now be described.

Figure 7:
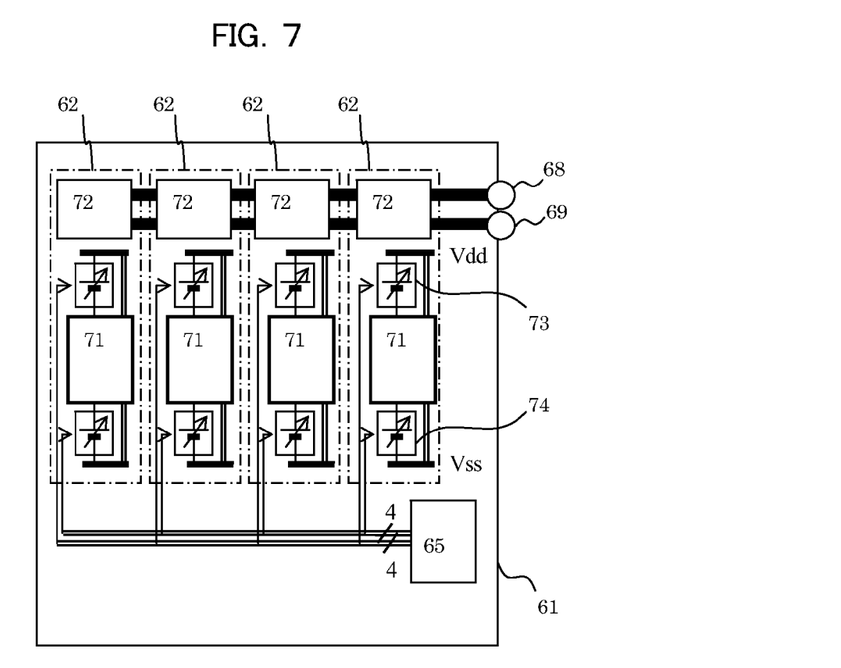
FIG. 7 is a circuit diagram depicting an example of a system board in a fourth information processing device.

In the fourth information processing device, substrate bias circuits are provided inside CPU modules. The fourth information processing device is provided with plural system boards. FIG. 7 is a circuit diagram depicting an example of a system board in the fourth information processing device. The system board 61 is provided with four CPU modules 62, a Vth control circuit 65, a VDD terminal 68, and a VSS terminal 69. The CPU modules 62 each have a core 71, a DDC (DC-DC converter) 72, and substrate bias circuits 73 and 74.

The VDD terminal 68 is connected to an external high potential VDD. The VSS terminal 69 is connected to an external low potential. The DDC 72 applies a high potential Vdd and a low potential Vss to the core 71, based on potentials of the VDD terminal 68 and VSS terminal 69.

The Vth control circuit 65 sets a value of Vbs_P in the substrate bias circuits 73 as well as a value of Vbs_N in the substrate bias circuits 74. The substrate bias circuit 73 is connected between Vdd of the DDCs 72 and back gates of PMOS in the cores 71, and sets Vbs_P in accordance with an instruction from the Vth control circuit 65. The substrate bias circuit 74 is connected between Vss of the DDCs 72 and back gates of NMOS in the cores 71, and sets Vbs_N in accordance with an instruction from the Vth control circuit 65.

According to the fourth information processing device, Vth (Ioff) which is obtained by a design program can be set by setting values of Vbs_N and Vbs_P in the Vth control circuit 65.

A next description will be made of specific examples of performance and power achieved by the design programs described above.

Specs of transistors will be described first.

An SD leakage current IoffX and an ON current IonX per unit length of transistor width will now be defined. X represents N or P. An IonX-IoffX characteristic as a transistor characteristic is known to be linear on IonX and Ioff axes which are respectively expressed as a linear axis and as a logarithmic axis. That is, the IonX-IoffX characteristic is expressed by an expression below.

$$IonX = A * \ln(IoffX) + B \text{ (where } A \text{ and } B \text{ are constants)}$$

In addition, IonX strongly influences the operation speed. As IonX decreases, the operation speed decreases. Supposing that a composite amount of IonN and IonP is Ion and transistor widths of NMOS and PMOS are respectively Wn and Wp, Ion is expressed by an expression below.

$$Ion = (IonN + (Wp/Wn) * IonP)/2$$

At this time, the operation speed f relative to Ion is expressed by an expression below.

$$f = C * \exp(D * Ion) \text{ (where } C \text{ and } D \text{ are constants)}$$

Similarly, supposing that a composite amount of IoffN and IoffP is Ioff, Ioff is expressed by an expression below.

$$Ioff = (IoffN + (Wp/Wn) * IoffP)/2$$

Figure 8:
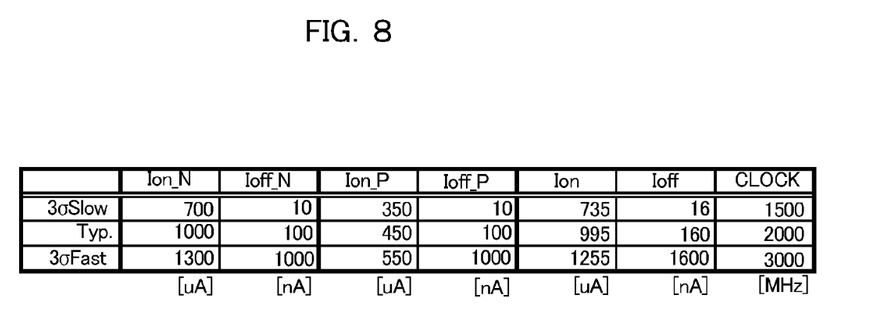
FIG. 8 is a table representing an example of transistor specs.

FIG. 8 is a table representing an example of transistor specs. In this example, Wp/Wn=2.2 and clock frequency of 2 (GHz) are given. The table indicates a typical value (Typ.) and a lower limit (3σSlow) and an upper limit (3σFast) of a 3σ variation range for each of IonN (μA), IoffN (μA), IonP (nA), IoffP (μA), Ion (μA), Ioff (nA), and clock frequency (MHz).

In the following, performance index IPC (Instruction Per Cycle)=2, leakage power of 50 (W/core), and active power of 60 (W/core) are given.

Next, performance and power of a chip where the number of cores is changed from one to eight will be described in comparison with two conventional cases and a case according to the present embodiment.

Figure 9:
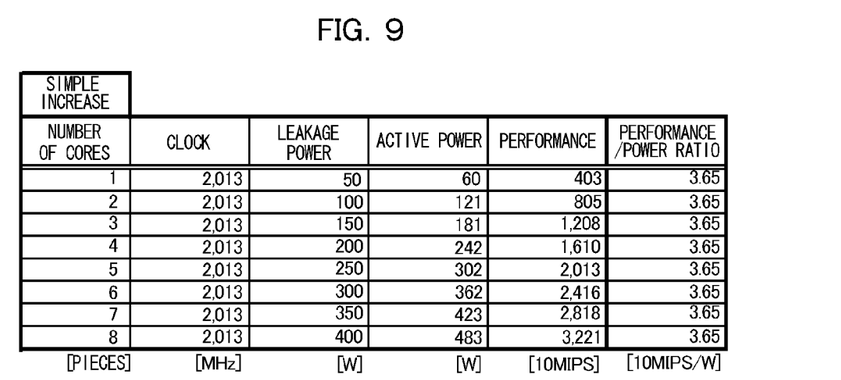
FIG. 9 is a table representing an example of performance and power of a chip in a first case.

Next, a case of carrying out no power adjustment depending on the number of cores will be described as a first case. FIG. 9 is a table representing an example of performance and power of a chip in a first case. This table indicates items of clock frequency (MHz), leakage power (W), active power (W), performance (10MIPS), and performance-to-power ratio (performance/power ratio) (10MIPS/W), for each number of cores (pieces). The performance is supposed to be (number of cores*clock frequency*IPC) for the purpose of simplification. The performance-to-power ratio indicates performance per unit power and is supposed to be (performance/(leakage power+active power)). In the following, chips are evaluated by the performance-to-power ratio.

In this case, the power (leakage power+active power) is proportional to the number of cores. Also, the performance is proportional to the number of cores. Therefore, the performance-to-power ratio is constant regardless of the number of cores. However, where the number of cores is eight, the power is an unreal value.

Figure 10:
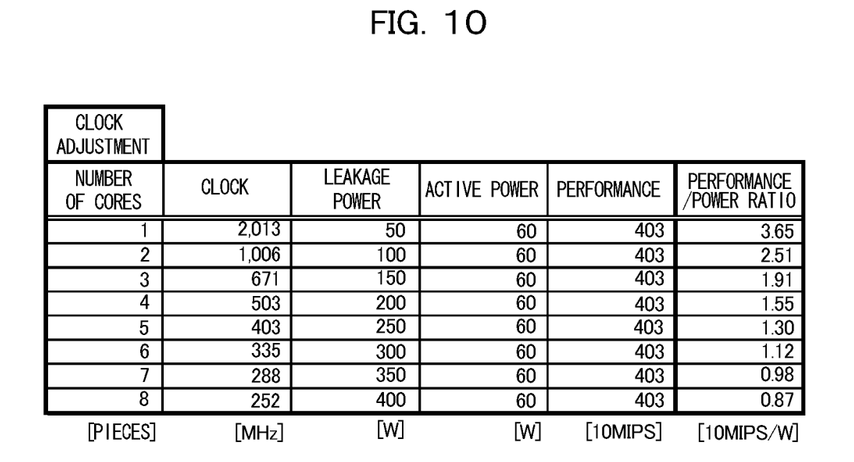
FIG. 10 is a table representing an example of performance and power of a chip in a second case.

Next, a case of adjusting the clock frequency depending on the number of cores will be described as a second case. FIG. 10 is a table representing an example of performance and power of a chip in the second case. This table indicates the same items as those in FIG. 9. In this case, the clock frequency is adjusted in inverse proportion to the number of cores.

In this case, the performance and the active power are proportional to the clock frequency, and therefore, the performance of the entire chip and the active power are constant regardless of the number of cores. However, since the leakage power is also proportional to the number of cores, the performance-to-power ratio drops in accordance with increase in number of cores.

Figure 11:
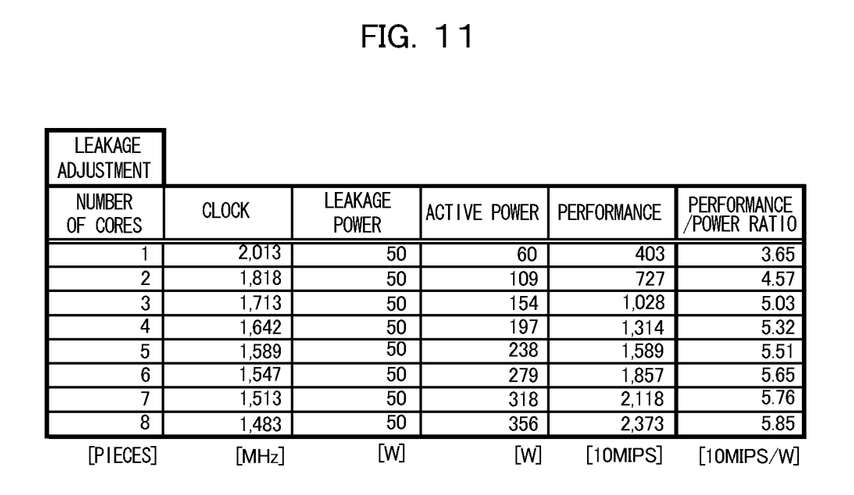
FIG. 11 is a table representing an example of performance and power of a chip in a third case.

Next, a case of adjusting Ioff depending on the number of cores by using a design program according to this embodiment will be described as a third case. FIG. 11 is a table representing an example of performance and power of a chip in the third case. This table indicates the same items as those in FIG. 9. In this case, Ioff is adjusted so that the leakage power is inversely proportional to the number of cores.

As described above, Vth rises and the operation speed accordingly decreases as Ioff is decreased to decrease the leakage power. The clock frequency decreases as a result. In this case, clock frequency Freq is calculated by using experimental expressions described below, which are derived from correlation between the transistor specs in FIG. 8 and an operation speed obtained by a Spice simulation.

$$IonN = 130.3 \ln(IoffN) + 400$$

$$IonP = 43.4 \ln(IoffP) + 250$$

$$Ion = (IonN + 2.2 IonP)/2$$

$$Freq = 552.2 \exp(0.0013 \, Ion)$$

In this case, the performance and the active power are proportional to the number of cores while the leakage power is constant regardless of the number of cores. Accordingly, as the number of cores increases, the performance-to-power ratio increases although the performance-to-power ratio tends to be saturated.

Figure 12:
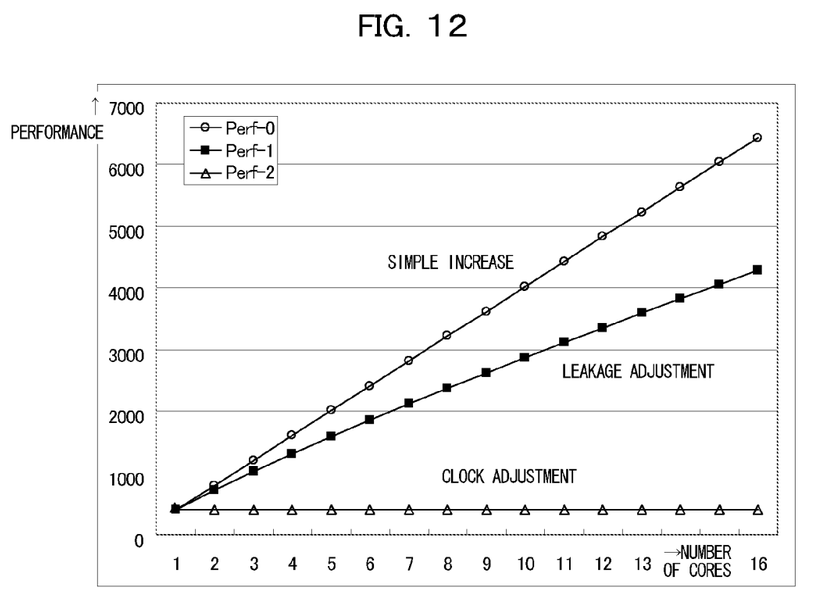
FIG. 12 is a graph representing an example of relationships between the number of cores and performance.
Figure 13:
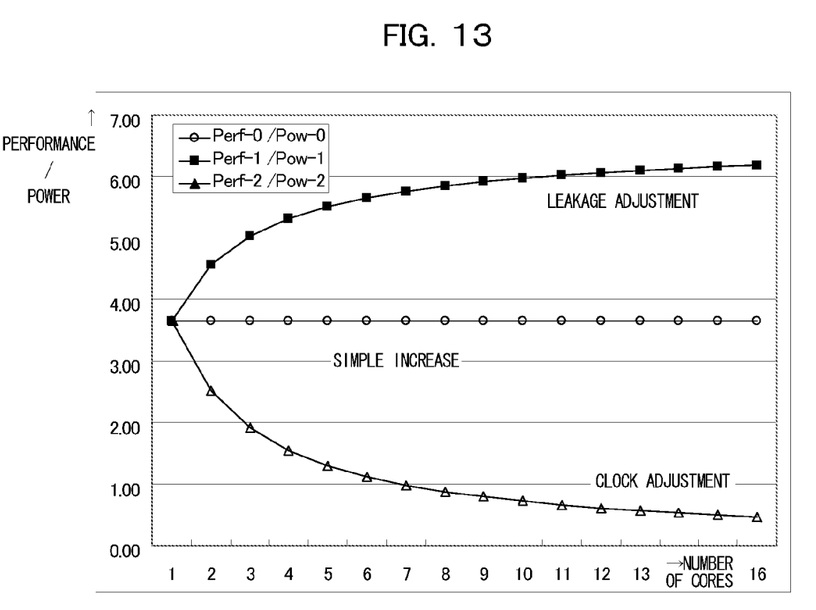
FIG. 13 is a graph representing an example of relationships between the number of cores and performance-to-power ratio.

Described next will be relationships between the number of cores and the performance and between the number of cores and the performance-to-power ratio in the foregoing three cases. FIG. 12 is a graph representing an example of relationships between the number of cores and the performance. FIG. 13 is a graph representing an example of relationships between the number of cores and the performance-to-power ratio. In these graphs, the first case corresponds to a curve denoted by "simple increase". The second case corresponds to a curve denoted by "clock adjustment". The third case corresponds to a curve denoted by "leakage adjustment". In the third case, the leakage power is adjusted so as to be the same value as that when the number of cores is one while the performance is maintained at about 0.8 times the performance in the first case. Therefore, the third case results in the highest index of the performance-to-power ratio.

According to this embodiment, the leakage power, active power, and clock frequency can be determined so that efficiency of performance relative to power may not be hindered when designing a multi-core LSI or a multi-processor system.

In CMOS technology of 3.3 V to 1.0 V generation, a power supply voltage and a minimum channel length are set so as to maintain substantially constant electric field scaling. When 90 nm generation was achieved, the power supply voltage reached 1.0 V. In further generation following this generation, scaling (reduction of power supply voltage) maintaining a constant electric field is difficult to achieve. This implies that, if miniaturization further proceeds, channels of transistors encounter a higher electric field, and leakage current of transistors per unit width stays almost equal to that at present or increases more. Supposing that the leakage current per transistor width is maintained equal to that at present, the leakage current per core is expected to be about 0.7 times that at present since a shrink rate in a transistor width direction is applied. However, if the chip area stays equal, the degree of integration is twice higher, and the leakage current per core is therefore 1.4 times that at present. Even in future CMOS technology, the leakage current may remain a problem as ever.

Meanwhile, the active power is already close to an operating limit per chip since the clock frequency has reached multi-gigahertz. A future main trend is not expected to be further increase of the clock frequency but is expected to be a mechanism of improving performance by introducing multiple cores.

Although a greater number of cores can be built in by further miniaturization, the leakage current is not expected to decrease. Therefore, a method of improving efficiency of performance relative to power by changing leakage power depending on the number of cores, as described in this embodiment, is effective.

Further, a program which causes a computer constituting a device for designing an information processing device to execute processing steps described above can be provided as a program for designing an information processing device. By storing the program described above in a computer-readable recording medium, the computer constituting a device for designing an information processing device can be caused to execute the program. Such a computer-readable recording medium is intended to cover an internal storage device such as a ROM or RAM built in a computer, a CD-ROM or flexible disk, a DVD disk, a magneto-optical disk, a portable storage medium such as an IC card, a database storing a computer program, or another computer and a database thereof.

As has been described above, according to an aspect of the present invention, an information processing device can improve performance relative to power.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An information processing device comprising:
   a plurality of processor cores each including a plurality of transistors; and
   at least one substrate bias circuit that supplies each of the plurality of transistors with a substrate bias voltage that is determined based on the number of the processor cores, wherein
   the plurality of processor cores have the same structure as each other, and
   the substrate bias voltage is determined so that a threshold voltage for the plurality of transistors rises as the number of the plurality of processor cores increases.

2. The information processing device according to claim 1, wherein the threshold voltage is determined so that leakage power of the plurality of transistors is inversely proportional to the number of the plurality of processor cores.

3. The information processing device according to claim 1, wherein
   the plurality of transistors are CMOS, and
   the at least one substrate bias circuit is constituted by a PMOS substrate bias circuit that supplies a substrate bias voltage for PMOS in the CMOS, and an NMOS substrate bias circuit that supplies a substrate bias voltage for NMOS in the CMOS.

4. The information processing device according to claim 1, wherein
   the plurality of processor cores are provided in one chip, and
   the at least one substrate bias circuit is provided outside the chip.

5. The information processing device according to claim 1, further comprising a setting unit that sets the substrate bias voltage in the at least one substrate bias circuit.

6. The information processing device according to claim 5, wherein
   the plurality of processor cores is provided in one chip,
   the at least one substrate bias circuit and the setting unit are provided for each of the plurality of processor cores in the chip, and
   the setting unit is constituted of scan registers connected to each other, and sets the substrate bias voltage of the at least one substrate bias circuit, based on a value that is externally input from outside by scanning.

7. The information processing device according to claim 5, wherein
   the plurality of processor cores are provided in respectively different modules,
   for each of the modules, the at least one substrate bias circuit is provided outside corresponding one of the modules, and
   the setting unit is provided outside the modules.

8. The information processing device according to claim 5, wherein
   the plurality of processor cores are provided in respectively different modules,
   for each of the modules, the at least one substrate bias circuit is provided inside corresponding one of the modules, and
   the setting unit is provided outside the modules.

9. A method for designing an information processing device having a plurality of processor cores, the method comprising:
   obtaining design data for the plurality of processor cores, transistor specs information indicating specs of transistors used in the plurality of processor cores, and device specs information indicating specs of the information processing device;
   calculating performance and power of one of the plurality of processor cores, based on the obtained design data and the obtained transistor specs information;
   calculating performance and power of the information processing device that uses the processor cores of a set number, based on the obtained device specs information and the calculated performance and power of the one of the plurality of processor cores; and
   determining a number of the plurality of processor cores and a substrate bias voltage supplied to the transistors, based on the calculated performance and power of the information processing device, wherein
   the plurality of processor cores have the same structure as each other, and
   the determining determines the substrate bias voltage so that a threshold voltage for the transistors rises as the number of the plurality of processor cores increases.

10. The method according to claim 9, wherein
    the transistor specs include a relationship among an On current, an Off current, and a threshold voltage of the transistors and
    the device specs information includes upper limits to required performance and power consumption of the information processing device.

11. The method according to claim 10, wherein
    the determining calculates the performance and power of the information processing device and changes the number of the plurality of processor cores and the substrate bias voltage, repeatedly, until the calculated performance of the information processing device meets the required performance and the calculated power of the information processing device becomes equal to or lower than the upper limit of the power consumption.

12. The method according to claim 9, wherein
    the calculating of the performance and power of the one of the plurality of processor cores calculates leakage power and active power of the one of the plurality of processor cores, based on the design data and the transistor specs information, and assigns a total of the leakage power and the active power to the power of the one of the plurality of processor cores, and
    the calculating of the performance and power of the information processing device, leakage power and active power of the information processing device are calculated based on the obtained device specs information and the calculated performance and power of the one of the plurality of processor cores, and assigns a total of the leakage power and the active power is taken to power of the plurality of processor cores of the information processing device.

13. The method according to claim 12, wherein
the determining determines the threshold voltage in order that leakage power of the plurality of transistors is inversely proportional to the number of the plurality of processor cores.

14. The method according to claim 13, wherein
the plurality of transistors are CMOS, and
the substrate bias voltage includes a substrate bias voltage for PMOS in the CMOS, and a substrate bias voltage for NMOS in the CMOS.

15. A computer-readable non-transitory medium having recorded thereon a program which causes a computer to execute a process for designing an information processing device having a plurality of processor cores, the process comprising:

obtaining design data for the plurality of processor cores, transistor specs information indicating specs of transistors used in the plurality of processor cores, and device specs information indicating specs of the information processing device;

calculating performance and power of one of the plurality of processor cores, based on the obtained design data and the obtained transistor specs information;

calculating performance and power of the information processing device that uses the processor cores of a set number, based on the obtained device specs information and the calculated performance and power of the one of the plurality of processor cores; and determining a number of the plurality of processor cores and a substrate bias voltage supplied to the transistors, based on the calculated performance and power of the information processing device, wherein the plurality of processor cores have the same structure as each other, and the determining determines the substrate bias voltage so that a threshold voltage for the transistors rises as the number of the plurality of processor cores increases.

* * * * *